United States Patent [19]

Miller

[11] 4,183,010
[45] Jan. 8, 1980

[54] PRESSURE COMPENSATING COAXIAL LINE HYDROPHONE AND METHOD

[75] Inventor: G. Kirby Miller, Saratoga, Calif.

[73] Assignee: GTE Sylvania Incorporated, Mountain View, Calif.

[21] Appl. No.: 777,014

[22] Filed: Mar. 14, 1977

Related U.S. Application Data

[63] Continuation-in-part of Ser. No. 638,540, Dec. 8, 1975.

[51] Int. Cl.$^2$ ............................................. G01V 1/38
[52] U.S. Cl. ................................. 367/154; 307/400; 310/800; 174/101.5; 174/110 FC; 367/159; 367/171
[58] Field of Search ........... 340/7 R; 174/70 R, 101.5, 174/113 R, 110 FC; 307/88 ET; 310/800

[56] References Cited

U.S. PATENT DOCUMENTS

| | | | |
|---|---|---|---|
| 3,607,754 | 9/1971 | Asahina et al. | 307/88 ET |
| 3,763,482 | 10/1973 | Burney | 340/258 R |
| 3,792,204 | 2/1974 | Murayama | 310/8.2 |
| 3,798,474 | 3/1974 | Cassand et al. | 310/338 |
| 3,921,125 | 11/1975 | Miller | 340/7 R |
| 3,940,974 | 3/1976 | Taylor | 307/88 ET |
| 3,970,862 | 7/1976 | Edelman et al. | 307/88 ET |

OTHER PUBLICATIONS

"High Pressure Transducer", G. Kirby Miller, Jan. 10, 1973, *GTE Sylvania, Inc. Technical Report*, 46 pp.

*Primary Examiner*—Howard A. Birmiel
*Attorney, Agent, or Firm*—John F. Lawler

[57] ABSTRACT

The utility of a coaxial electret cable transducer as a hydrophone at shallow depths (low hydrostatic pressure) is extended for operation at substantially greater depths (high hydrostatic pressure) by the combination of the electret with a polymer material having piezoelectric properties, i.e., a piezoid. The electret and piezoid are separate flexible materials radially stacked within the cable or alternatively and preferably constitute a single material formed to have both electret and piezoelectric properties. One substance useful as the piezoid or as the electret-piezoid combination is polyvinylidene fluoride ($PVF_2$).

The invention also comprehends the method of measuring underwater soundings at either low or high hydrostatic pressures with the aforementioned coaxial cable as an electrostatic transducer by measuring electrical signals generated across the cable conductors when the ambient pressure is low and as a piezoelectric transducer across the conductors when such pressure is high.

5 Claims, 5 Drawing Figures

PRESSURE COMPENSATING COAXIAL LINE HYDROPHONE AND METHOD

This is a continuation-in-part of Ser. No. 638,540, filed Dec. 8, 1975.

BACKGROUND OF THE INVENTION

This invention relates to hydrophones and more particularly to an improved coaxial electret line hydrophone and method detecting underwater vibrations.

The coaxial electret cable described in U.S. Pat. No. 3,763,482 is an extemely sensitive transducer capable of detecting mechanical impacts and vibrations applied to the exterior of the cable at any point along its length. Such a transducer is useful as a hydrophone for sensing underwater vibrations such as soundings during undersea seismic exploration and the like. For example, the coaxial electret cable may be towed behind a surface vessel at depths up to 1,500 meters for sensing sonic vibrations reflected from the floor of the sea and providing output signals indicative of the character and composition of the sea floor. An embodiment of this cable in a hydrophone is described in U.S. Pat. No. 3,921,125.

A difficulty experienced with the use of the aforementioned electret cable as a hydrophone is a substantial loss of sensitivity when exposed to hydrostatic pressures equivalent to ocean depths of thousands of feet. Such loss of sensitivity is believed to be due to the increased stiffness and vanishing volume of the air trapped between the outer jacket or cover of the cable and the dielectric layer as hydrostatic pressure increases. As a result, a given acoustic signal applied to the cable exterior produces a greatly reduced radial displacement of the cable outer conductor (shield) relative to the electret (dielectric layer) at these higher static pressures. At lower static pressures, this trapped air is under less pressure and is therefore more compliant and voluminous so that radial displacement of the outer conductor relative to the electret layer is proportionally less restricted, resulting in a more sensitive transducer. The loss of cable transducer sensitivity with increasing hydrostatic pressures limits the usefulness of the cable as a hydrophone. This invention is directed to a solution to this problem.

OBJECTS AND SUMMARY OF THE INVENTION

An object of this invention is the provision of a coaxial line hydrophone which automatically compensates for the lack of sensitivity of the hydrophone under high hydrostatic pressures.

A further object is the provision of such a hydrophone with a sensitivity to acoustic pressures that is substantially independent of ambient pressure.

Still another object is the provision of a novel method of detecting underwater vibrations at both shallow depths (low hydrostatic pressure) and large depths (high hydrostatic pressure) without loss of sensitivity.

A further object is the provision of an inexpensive method of detecting underwater soundings at large and small depths without loss of sensitivity.

These and other objects of the invention are achieved with a coaxial cable having radially spaced conductors and intermediate dielectric filler material that has both piezoelectric and electret properties and by measuring electrostatically generated electrical signals between the conductors at low hydrostatic pressures and piezoelectrically generated signals at high hydrostatic pressures. As the stiffness of the air trapped under the cable jacket increases with increased hydrostatic pressure, piezoelectric output in response to compression forces applied to the jacket also increases and compensates for the corresponding decrease in electrostatic output.

DESCRIPTION OF PREFERRED EMBODIMENTS

Figure 1:
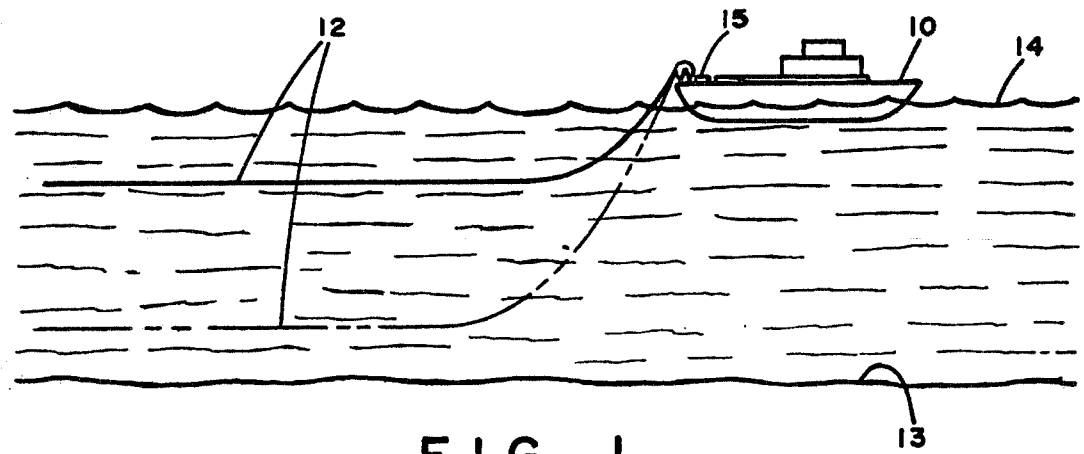
FIG. 1 is a schematic view of a coaxial line hydrophone deployed substantially horizontally for undersea seismic exploration.

Referring now to the drawings, FIG. 1 shows a surface ship 10 from which a coaxial electret cable 12 embodying the invention trails in the water between the sea floor 13 and the surface 14. The cable may be submerged to depths of 1,000 to 3,000 meters or greater and may be 1,000 meters or greater in length for the purpose of detecting reflections of seismic waves from the sea floor in the manner well known in the art of undersea geophysical exploration. Electrical signals induced in the cable by vibrations from underwater detonations are recorded and analyzed by suitable electronic equipment 15 carried on the vessel 10 for carrying out the purposes of the exploration. The nature of the undersea exploration may require that the cable 12 be submerged at a shallow depth as shown in solid line or at a greater depth as indicated in broken lines.

Figure 2:
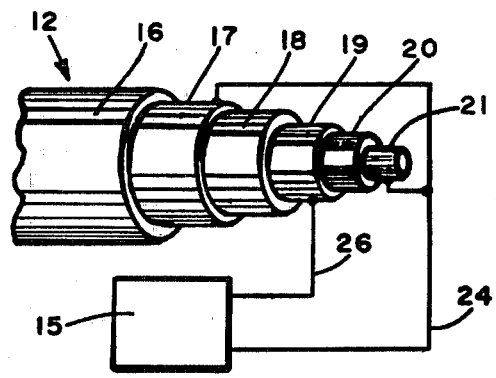
FIG. 2 is a fragmentary cut-away perspective view of a coaxial cable transducer embodying this invention.
Figure 3:
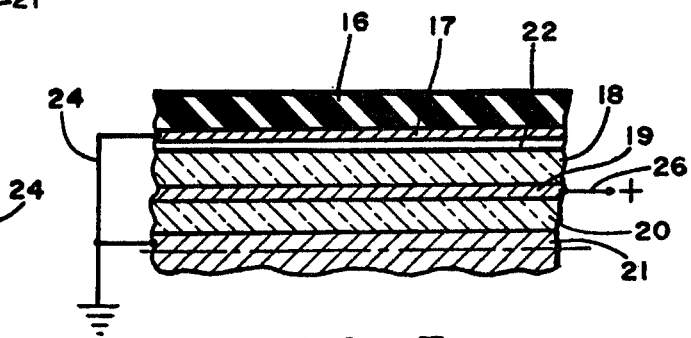
FIG. 3 is a greatly enlarged longitudinal section of part of the transducer of FIG. 2.

In accordance with one form of the invention, as shown in FIGS. 1 and 2, cable 12 has a coaxial configuration and comprises an outer jacket or covering 16, an outer conductor or shield 17, an electret layer 18 such as tetrafluoroethylene (Teflon), an intermediate conductor 19, a flexible polymer layer 20 such as polyvinylidene fluoride (PVF$_2$) conditioned to have piezoelectric properties, and inner conductor 21. An air gap 22 exists between shield 17 and the electret layer 18 and is the result of normal cable manufacturing procedures. In this embodiment, outer conductor 17 and inner conductor 21 are connected by a common input lead 24 to the signal processing equipment 15 and intermediate conductor 19 is connected to the other input lead 26.

In operation, the application of a force or vibration to the exterior of the cable when it is exposed to low hydrostatic pressures causes outer conductor 17 to move relative to the electret layer 18 and produce an output signal between outer conductors 17 and intermediate conductor 19. This action is described in greater detail in the foregoing U.S. Pat. No. 3,763,482. When the cable is subjected to substantially greater hydrostatic pressures, the resulting compression of air layer 22 prevents movement of the outer conductor relative to electret layer 18. The stiffness of air layer 22, however, provides more efficient coupling of the externally applied force to the piezoelectric layer 20 which reacts to the compressional stress to produce an output across the intermediate conductor 19 and the inner conductor 21.

Since the signal sensitivity of the cable due to electret layer 18 and piezoelectric layer 20 are proportionately less and greater, respectively, with an increase in hydrostatic pressure, the sensitivity of the cable is essentially independent of hydrostatic pressure.

Figure 4:
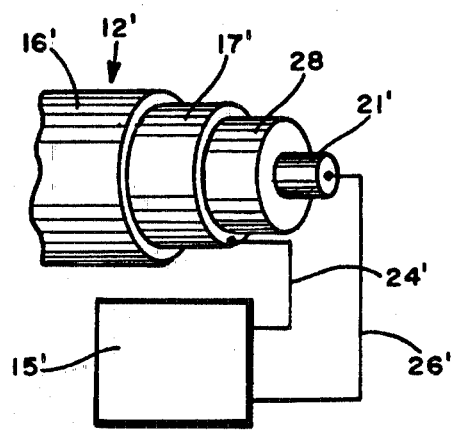
FIG. 4 is a view similar to FIG. 2 showing a modified form of the invention.
Figure 5:
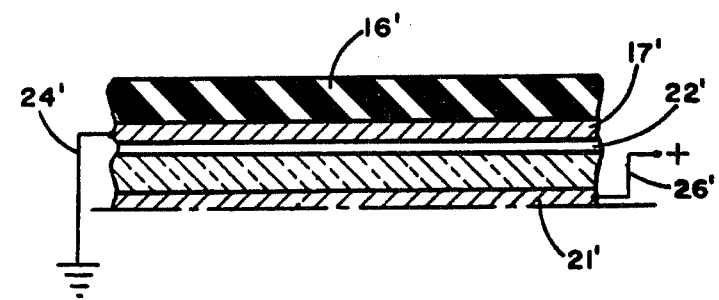
FIG. 5 is a view similar to FIG. 3 showing the details of construction of the transducer of FIG. 4.

In the modified and preferred form of the invention shown in FIGS. 4 and 5 in which like parts are indicated by the primes of like reference numbers, cable 12' has a single dielectric layer 28 between outer conductor 17' and inner conductor 21' that has both electret and piezoelectric properties. Such dielectric layer, for example, is the polymer polyvinylidene fluoride (PVF$_2$) which has been poled through simultaneous application of heat and electrostatic field as more fully described, for example, in a paper entitled "Persistent Polarization in Poly(vinylidene Fluoride) I. Surfaces Charges and Piezoelectricity of Poly(vinylidene Fluoride) Thermoelectrets" by Naohiro Murayama, Journal of Polymer Science, Polymer Physics Edition, Vol. 13, 929–946 (1975). The resulting condition of the polymer is that it has both electret and piezoelectric properties. The dielectric layer 28 of this material in the hydrophone cable when exposed to a hydrostatic pressure gradient has a complementary reaction so that the cable sensitivity is substantially independent of ambient pressure. The advantage of cable 12' with the combination electret-piezoid layer over the structure of cable 12 with the separate electret and piezoid layers is simplicity of construction and a higher sensitivity of the piezoelectric properties of the single layer because of its proximity to the exterior of the cable. In addition, cable 12' is producible on standard coaxial cable-making machinery using the dielectric filler material that is capable of exhibiting both electret and piezoelectric characteristics, thereby providing a sensor having such dual sensitivity properties at a cost comparable to standard coaxial cable.

This invention also comprehends the method of detecting mechanical vibrations applied to the exterior of a coaxial cable in both high and low ambient pressure conditions as may be experienced under water at small depths (<30 meters) and large depths (>100 meters). Such method consists of measuring electrostatically generated signals across cable conductors when the cable is in a low ambient pressure environment and measuring piezoelectrically generated signals across cable conductors when the cable is in a high ambient pressure environment, and measuring a combination of such signals across those conductors when the ambient pressure is between the low and high value limits.

The hydrophone and underwater detecting method embodying this invention may also be employed with utility and advantage by disposing cable 12 or 12' vertically rather than substantially horizontally in the water. By way of example, the lower end of the cable may be weighted and the upper end connected to a float or buoy with suitable telemetering equipment for transmitting signals detected by the hydrophone to remote receiving apparatus. Such vertical hydrophone deployment has the advantage of high sensitivity to horizontally propagating acoustic signals. The merit of the structure and method of pressure compensation according to the invention is further emphasized in such a deployment in which the hydrophone is subjected to linearly varying hydrostatic pressure over its full length.

What is claimed is:

1. A hydrophone having first and second output terminals and adapted to produce an electrical signal across said terminals in response to application of a mechanical force thereto, said hydrophone comprising a coaxial cable having first conductor means electrically connected to said first terminal and second conductor means electrically connected to said second terminal, said first conductor means comprising outer and inner conductors spaced outwardly and inwardly, respectively, from said second conductor means, and dielectric means comprising an electret disposed between said second conductor means and one of said conductors and a piezoid disposed between said second conductor means and the other of said conductors.

2. The hydrophone according to claim 1 in which said electret is disposed between said second conductor means and said outer conductor, said piezoid being disposed between said second conductor means and said inner conductor.

3. The hydrophone according to claim 1 in which said electret comprises tetrafluoroethylene and said piezoid comprises polyvinylidene fluoride (PVF$_2$).

4. The method of detecting mechanical vibrations applied to the exterior of a coaxial cable transducer in high and low ambient pressures, said transducer having at least two radially spaced conductors and dielectric means between the conductors, said dielectric means having electret and piezoelectric properties, consisting of the steps of measuring electrostatically generated signals across said conductors and the dielectric means when the ambient pressure is low, measuring piezoelectrically generated signals across said conductors and dielectric means when said ambient pressure is high, and measuring electrostatically and piezoelectrically generated signals across said conductors and the dielectric means when said ambient pressure is between the high and low value limits.

5. The method of sensing underwater soundings at small depths in which hydrostatic pressures are low and at large depths in which hydrostatic pressures are high consisting of the steps of forming a coaxial cable transducer with inner and outer conductors and intermediate dielectric filler having both electret and piezoelectric properties, connecting the conductors at one end of the transducer to electrical signal detecting apparatus, immersing said transducer in the water in which the soundings are to be sensed, measuring electrostatically generated signals produced by vibrations of the exterior of said transducer at the small depths and piezoelectrically generated signals at large depths whereby transducer sensitivity to underwater soundings is independent of hydrostatic pressure.

* * * * *